United States Patent
Ding et al.

(10) Patent No.: US 8,860,469 B1
(45) Date of Patent: Oct. 14, 2014

(54) APPARATUS AND METHODS FOR TRANSMITTER OUTPUT SWING CALIBRATION

(75) Inventors: Weiqi Ding, Fremont, CA (US); Wilson Wong, San Francisco, CA (US)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 13/549,228

(22) Filed: Jul. 13, 2012

(51) Int. Cl.
 *H03B 1/00* (2006.01)
 *H03K 3/00* (2006.01)

(52) U.S. Cl.
 USPC ............................................. 327/108; 326/68

(58) Field of Classification Search
 USPC ................................ 327/108, 112; 326/63, 68
 See application file for complete search history.

(56) References Cited

U.S. PATENT DOCUMENTS

| | | | |
|---|---|---|---|
| 5,757,303 A * | 5/1998 | Nakatani et al. | 341/159 |
| 6,940,303 B2 * | 9/2005 | Vargas | 326/30 |
| 7,541,838 B2 * | 6/2009 | Tian et al. | 326/83 |
| 7,863,936 B1 * | 1/2011 | Liu et al. | 326/86 |
| 7,932,740 B1 * | 4/2011 | Chao et al. | 326/30 |
| 2011/0050280 A1 | 3/2011 | Maddux et al. | |
| 2012/0112794 A1 * | 5/2012 | Chao et al. | 327/65 |

* cited by examiner

*Primary Examiner* — Quan Tra
(74) *Attorney, Agent, or Firm* — Okamoto & Benedicto LLP

(57) ABSTRACT

Disclosed are apparatus and methods to advantageously calibrate a transmitter output swing. One embodiment relates to a method for calibrating the output swing voltage of a transmitter. A fixed value is provided as the data input, and output swing calibration circuitry is connected to the transmitter buffer circuit. A transmitter current is set to an initial level, and the transmitter current is adjusted until the output swing of the transmitter buffer circuit is calibrated. Another embodiment relates to an integrated circuit which includes a transmitter buffer circuit, output swing calibration circuitry, and switches arranged to electrically connect the transmitter buffer circuit to the output swing calibration circuitry during an output swing calibration mode. Another embodiment relates to an output swing calibration circuit which includes comparison circuitry and logic and control circuitry.

19 Claims, 8 Drawing Sheets

APPARATUS AND METHODS FOR TRANSMITTER OUTPUT SWING CALIBRATION

BACKGROUND

1. Technical Field

The present invention relates generally to communication links including, but not limited to, serial interfaces for integrated circuits.

2. Description of the Background Art

Transceivers are used to form high speed serial interface (HSSI) links between integrated circuits (ICs). The transceivers typically use differential voltage signals to transmit and receive data. One aspect of the differential voltage signal that typically needs to be set accurately is the transmitter output swing for the differential voltage signal.

A conventional technique for calibrating the transmitter output swing use a current generated by a bandgap reference and an external (off-chip) resistor. However, using external resistor requires the use of an input/output (I/O) pin. The need to use an I/O pin is undesirable as I/O pins on an IC are a limited resource.

SUMMARY

One embodiment relates to a method for calibrating the output swing voltage of a transmitter. A fixed value is provided as the data input. A transmitter current is set to an initial level, and the transmitter current is adjusted until the output swing of the transmitter buffer circuit is calibrated.

Another embodiment relates to an integrated circuit which includes a transmitter buffer circuit, output swing calibration circuitry, and switches arranged to electrically connect the transmitter buffer circuit to the output swing calibration circuitry during an output swing calibration mode. The output swing calibration circuitry is arranged to provide a fixed data input value to the transmitter buffer circuit and calibrate an output swing of the transmitter buffer circuit.

Another embodiment relates to an output swing calibration circuit which includes comparison circuitry and logic and control circuitry. The comparison circuitry is arranged to compare a measured voltage difference between first and second nodes in the transmitter buffer circuit against a reference voltage difference and output a comparison result. The logic and control circuitry is arranged to provide a fixed data input value to the transmitter buffer circuit and adjust the output swing based on the comparison result.

Other embodiments, aspects, and features are also disclosed.

DETAILED DESCRIPTION

The present disclosure provides methods and circuit apparatus which calibrate accurately the transmitter output swing for a differential signal. The methods and apparatus described herein advantageously do not require the use of an external resistor and so avoid the need to use a pin on the integrated circuit for the purpose of output swing calibration.

Furthermore, the methods and apparatus described herein advantageously solve a problem not dealt with by the conventional output swing calibration technique. In particular, applicant has determined that the conventional technique does not account for intra-die process variations that may cause variations in resistor values amongst different transmitter circuits within a single integrated circuit. In other words, resistors on an IC which are designed to be the same may actually have resistor values that vary due to intra-die process variations. The presently-disclosed solution takes into account the effect of such intra-die variations during the calibration process because it is designed to be able to measure a voltage difference across an internal resistor within each transmitter circuit on the die.

Figure 1:
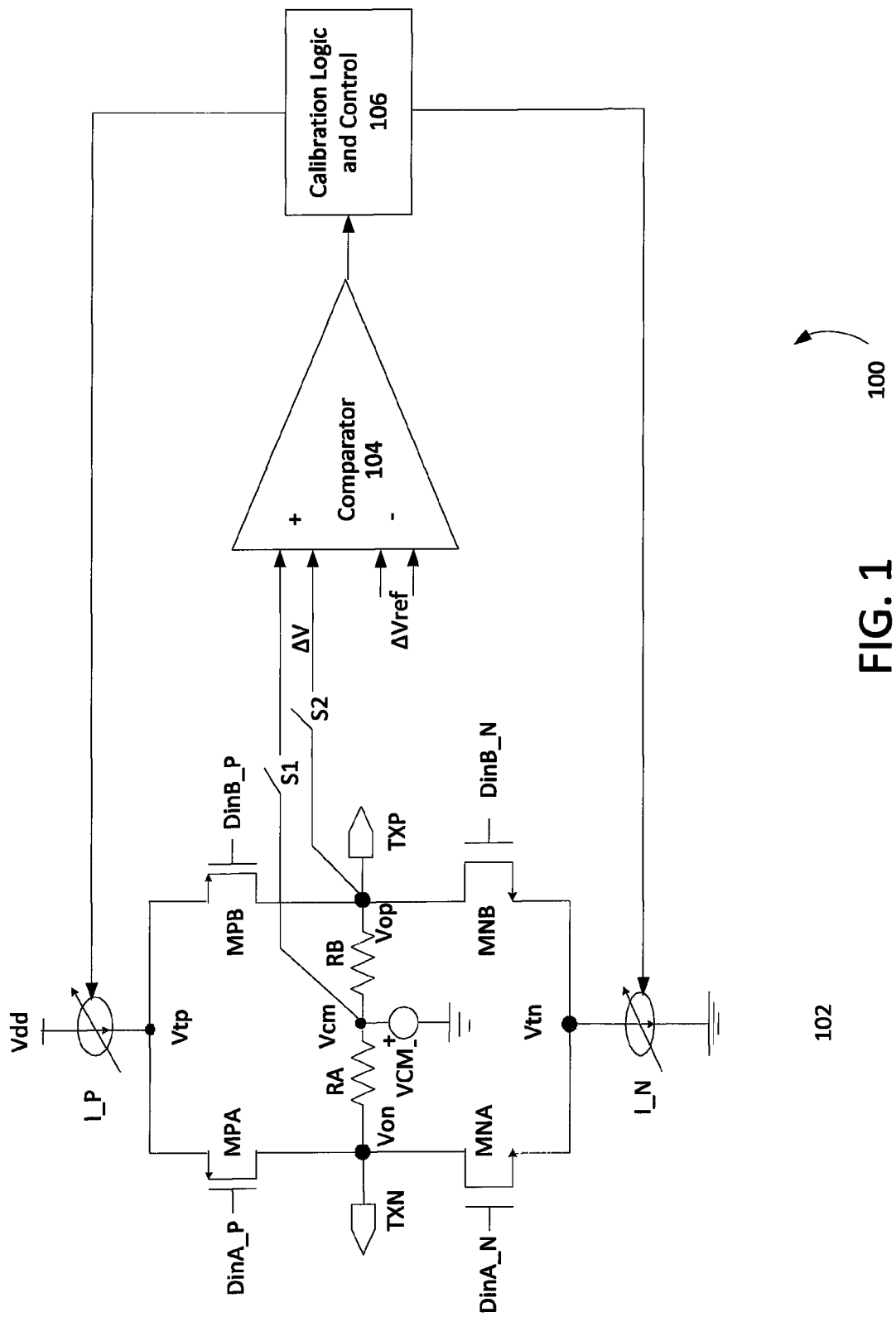
FIG. 1 is diagram of an exemplary circuit apparatus for transmitter output swing calibration in accordance with an embodiment of the invention.

FIG. 1 is diagram of an exemplary circuit apparatus 100 for transmitter output swing calibration in accordance with an embodiment of the invention. The circuit apparatus 100 includes at least a transmitter (TX) buffer circuit 102, a comparator 104, and calibration logic and control circuitry 106.

The TX buffer circuit 102 may be based on an H-tree buffer structure. The H-tree buffer structure includes four switches (MPA, MNA, MPB, and MNB) and pull-up and pull-down current drivers (I_P and I_N).

The pull-up current driver (I_P) may be a variable current source connected in series between power supply voltage source (Vdd) and the node Vtp, while the pull-down current driver (I_N) may be a variable current source connected in series between ground and the node Vtn.

On the left side of the H-tree, PMOS transistor MPA and NMOS transistor MNA are connected in series between nodes Vtp and Vtn. In particular, node Vtp is connected to the source of MPA, the drain of MPA is connected to the source of MNA at output node Von, and the drain of MNA is connected to the node Vtn. On the right side of the H-tree, PMOS transistor MPB and NMOS transistor MNB are also connected in series between nodes Vtp and Vtn. In particular, node Vtp is connected to the source of MPB, the drain of MPB is connected to the source of MNB at node Vop, and the drain of MNB is connected to the node Vtn.

Nodes Vop and Von are connected to differential outputs TXP and TXN, respectively, such that the final output signal is the differential signal (TXP−TXN). Two resistors RA and RB are connected in series between nodes Vop and Von. Common mode voltage node Vcm is located between the two resistors RA and RB and may be driven by a common mode driver VCM which may be a voltage source connected between Vcm and ground. In one specific implementation, RA and RB may each have a resistance of approximately fifty ohms.

During a normal operation mode, four single-ended clocked data signals DinA_P, DinA_N, DinB_P, and DinB_N) may be used to control the four switches (MPA, MNA, MPB, and MNB, respectively). The use of four single-ended clocked data signals to generate a differential signal is due, in part, to the fact that the PMOS switches (MPA and MPB) generally require different signals from the NMOS switches (MNA and MNB) because of voltage level switching. In this case, DinA_P and DinA_N are two single-ended clocked data signals that are used to generate the TXN output, and DinB_P and DinB_N are two single-ended clocked data signals that are used to generate the TXP output.

In the normal operation mode, a first switch S1 and a second switch S2 may both be open, so as to electrically isolate the TX buffer 102 from the comparator 104. Hence, in the normal operation mode, there is minimal parasitic impact on the differential output signal from the output swing calibration circuitry.

In accordance with an embodiment of the invention, during an output swing calibration mode, the differential output signal (TXP−TXN) may be forced to a fixed logic level, either high or low by the data signals. In other words, no data toggling occurs during this mode. For example, DinA_N and DinB_P may be set (at high and low voltages, respectively) so as to turn on MNA and MPB, while DinA_P and DinB_N may be set (at high and low voltages, respectively) so as to turn off MPA and MNB. In this case, TXP would be pulled up by Vdd, while TXN will be pulled down by ground, so that the differential output (TXP−TXN) is high. This causes electrical current to flow from Vop to Von across RA and RB in series. With the differential output signal fixed, a measurable voltage drops occur between Vop and Vcm and between Vcm and Von.

In the implementation shown in FIG. 1, the first switch S1 may be used to controllably connect Vcm to a first input terminal of the comparator 104, and the second switch S2 may be used to controllably connect Vop to a second input terminal of the comparator 104. The calibration logic and control circuitry 106 may include circuitry to control the closing and opening of the switches S1 and S2.

In the output swing calibration mode, the first switch S1 and the second switch S2 may both be closed such that Vcm and Vop are electrically connected to the first and second input terminals, respectively. The comparator 104 may be arranged to receive a first voltage difference and second voltage difference and compare the first voltage difference against the second voltage difference.

In the output swing calibration mode, the first voltage difference may comprise the measured voltage difference ΔV between Vop and Vcm, as shown. The second voltage difference may comprise a reference voltage difference ΔVref. ΔVref may be arranged to be the desired voltage between Vop and Vcm or half the desired voltage between Vop and Von.

In the output swing calibration mode, when ΔV is greater than ΔVref, then the comparator 104 may output a signal at a high state (logical one), and when ΔV is less than ΔVref, then the comparator 104 may output a signal at a low state (logical zero). The output signal from the comparator 104 may be provided to the calibration logic and control circuitry 106.

The calibration logic and control 106 may be arranged to provide a fixed data input value to the transmitter buffer circuit 102 and receive the output signal from the comparator 104. In the output swing calibration mode, the calibration logic and control circuitry 106 generates control signals that are applied to the current sources I_P and I_N of the TX buffer circuit 102. The control signals may change depending on the state of the calibration logic and control 106 and the output signal from the comparator 104. The calibration logic and control circuitry 106 may be implemented in either soft (programmable) logic circuitry or hard-wired logic circuitry.

Note that, while the embodiment depicted in FIG. 1 (and in FIG. 3 described below) measures the voltage across the resistor RB, alternate embodiments may measure the voltage across the resistor RA or across both RA and RB in series. In a first alternate embodiment, the first switch S1 may be arranged to connect to Von, and the second switch S2 may be arranged to connect to Vcm. In this embodiment, the first voltage difference ΔV may be the measured voltage difference between Vcm and Von (i.e. across RA). In a second alternate embodiment, the first switch S1 may be arranged to connect to Von, and the second switch S2 may be arranged to connect to Vop. In this embodiment, the first voltage difference ΔV may be the measured voltage difference between Vop and Von (i.e. across both RA and RB in series), and the reference voltage difference ΔVref would be arranged to be the desired voltage between Vop and Von.

Figure 2B:
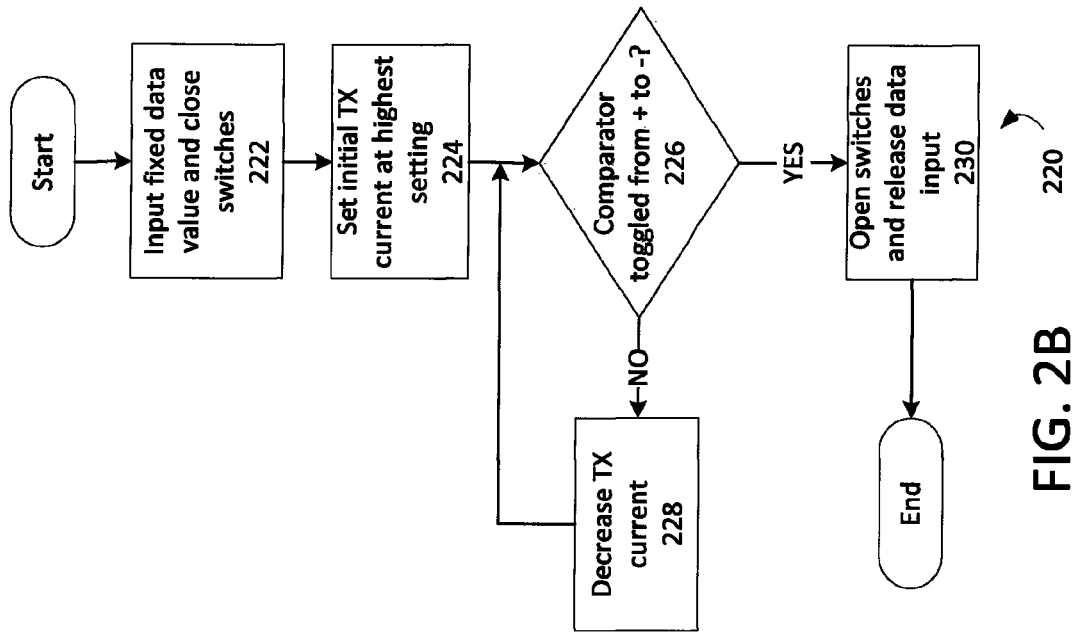
FIG. 2B is a flow chart of another method for transmitter output swing calibration using the circuit apparatus of FIG. 1 in accordance with an embodiment of the invention.
Figure 2A:
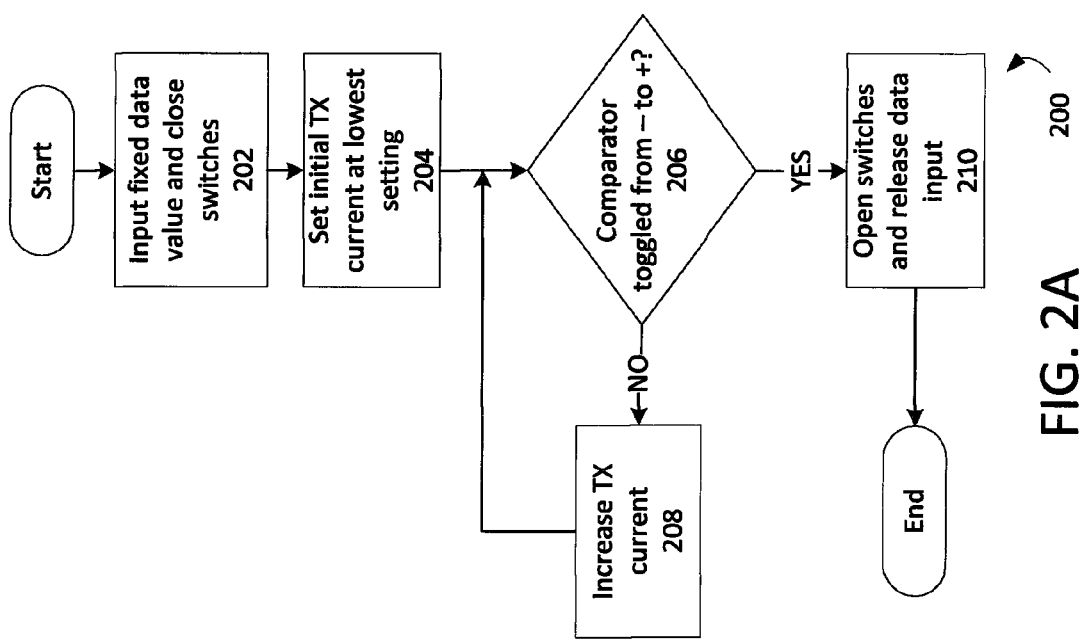
FIG. 2A is a flow chart of a method for transmitter output swing calibration using the circuit apparatus of FIG. 1 in accordance with an embodiment of the invention.

FIG. 2A is a flow chart of a method 200 for transmitter output swing calibration using the circuit apparatus 100 of FIG. 1 in accordance with an embodiment of the invention. As shown in step 202, when transmitter is set to the output swing calibration mode, a fixed data input signal may be provided to the TX buffer circuit 102, and the switches S1 and S2 may be closed so as to connect the comparator 104 to the TX buffer circuit 102.

Per step 204, the calibration logic and control 106 may then set the TX current to be initially at a lowest setting. This may be done by sending control signals to set the variable current sources I_P and I_N to their lowest current settings. With the TX current at its lowest setting, the measured voltage difference ΔV should be less than the reference voltage difference ΔVref such that the comparator 104 outputs a low (−) signal.

Thereafter, per step 206, a determination may be made as to whether the comparator 104 has toggled from the low (−) state to the high (+) state. If not, then, per step 208, the calibration logic and control circuitry 106 increases the TX current by increasing the current provided by the variable current sources I_P and I_N. The method 200 then loops back to the determination step 206. Hence, the calibration logic and control circuitry 106 continues to increase the TX current until the state of the comparator 104 toggles.

When it is determined per step 206 that the comparator has toggled from the low (−) state to the high (+) state, then the calibration logic and control circuitry 106 may decide that the output swing is properly calibrated. In that case, per step 210, the switches S1 and S2 may be opened, and the data input may be released from the fixed value, such that the TX buffer circuit 102 may return to a normal operating mode.

FIG. 2B is a flow chart of another method 220 for transmitter output swing calibration using the circuit apparatus 100 of FIG. 1 in accordance with an embodiment of the invention. As shown, per step 222, when transmitter is set to the output swing calibration mode, a fixed data input signal may be provided to the TX buffer circuit 102, and the switches S1 and S2 may be closed so as to connect the comparator 104 to the TX buffer circuit 102.

Per step 224, the calibration logic and control 106 may then set the TX current to be initially at a highest setting. This may be done by sending control signals to set the variable current sources I_P and I_N to their highest current settings. With the TX current at its highest setting, the measured voltage difference ΔV should be greater than the reference voltage difference ΔVref such that the comparator 104 outputs a high (+) signal.

Thereafter, per step 226, a determination may be made as to whether the comparator 104 has toggled from the high (+) state to the low (−) state. If not, then, per step 228, the calibration logic and control circuitry 106 may decrease the TX current by decreasing the current provided by the variable current sources I_P and I_N. The method 220 then loops back to the determination step 226. Hence, the calibration logic and control 106 continues to decrease the TX current until the state of the comparator 104 toggles.

When it is determined per step 226 that the comparator has toggled from the high (+) state to the low (−) state, then the calibration logic and control circuitry 106 may decide that the output swing is properly calibrated. In that case, per step 230, the switches S1 and S2 may be opened, and the data input may be released from the fixed value, such that the TX buffer circuit 102 may return to a normal operating mode.

Figure 3:
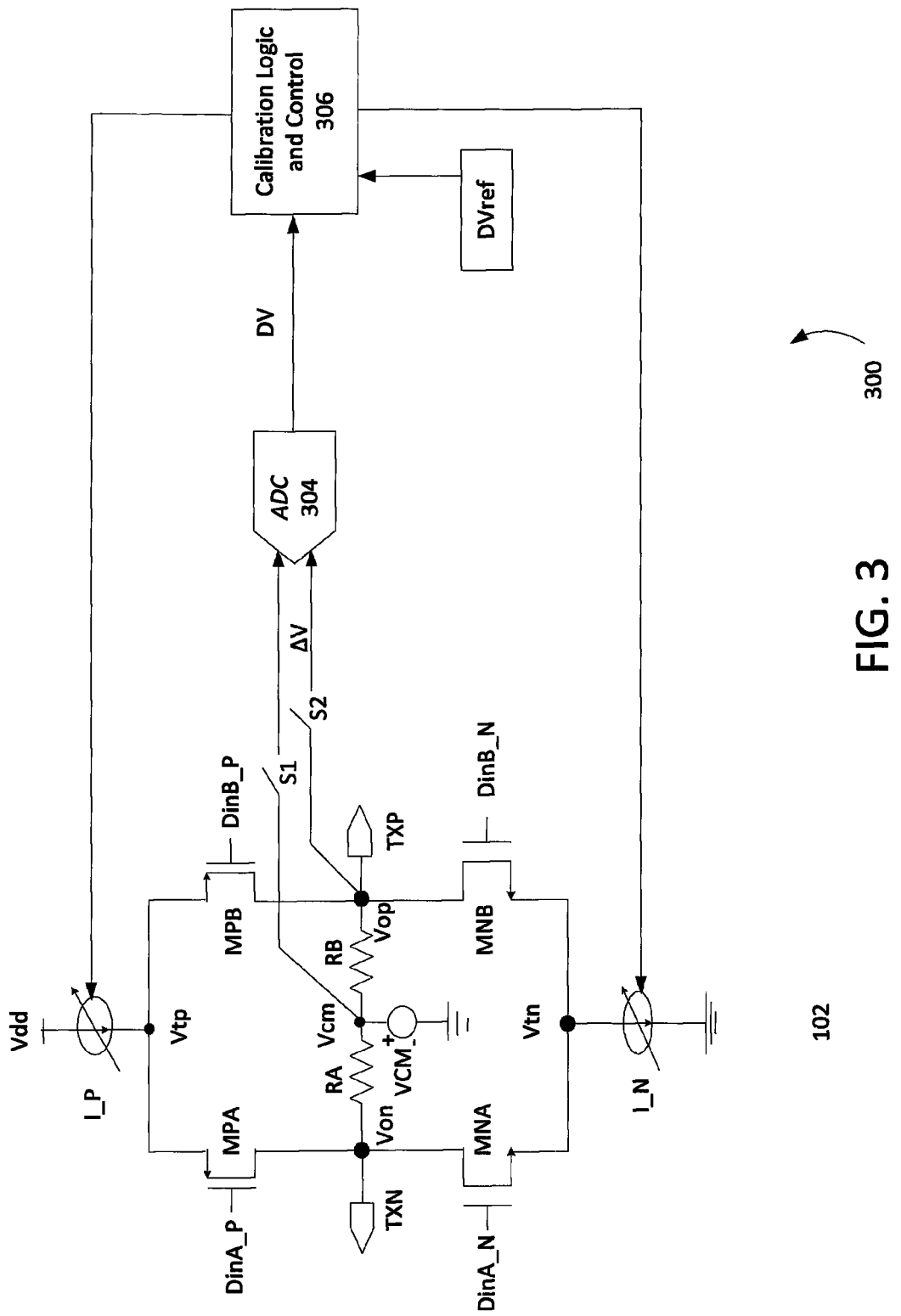
FIG. 3 is diagram of another exemplary circuit apparatus for transmitter output swing calibration in accordance with an embodiment of the invention.

FIG. 3 is diagram of another circuit apparatus 300 for transmitter output swing calibration in accordance with an embodiment of the invention. The circuit apparatus 300 of FIG. 3 is similar to the circuit apparatus 100 of FIG. 1. One difference is that an analog-to-digital converter (ADC) 304 receives the measured voltage difference ΔV in the circuit apparatus 300 of FIG. 3.

In the output swing calibration mode, the ADC 304 converts the measured voltage difference ΔV (which is an analog voltage) to a corresponding digital value DV. The digital value DV is output by the ADC 304 to the calibration logic and control circuitry 306.

The calibration logic and control circuitry 306 may include circuitry to provide a fixed data input value to the transmitter buffer circuit 102 and control the closing and opening of the switches S1 and S2. The calibration logic and control circuitry 306 may further include circuitry to generate control signals that are applied to the current sources I_P and I_N of the TX buffer circuit 102. The control signals may change depending on the state of the calibration logic and control circuitry 306, the digital value DV from the ADC 304, and a reference digital value DVref. The calibration logic and control circuitry 306 may be implemented in either soft (programmable) logic circuitry or hard-wired logic circuitry.

Figure 4B:
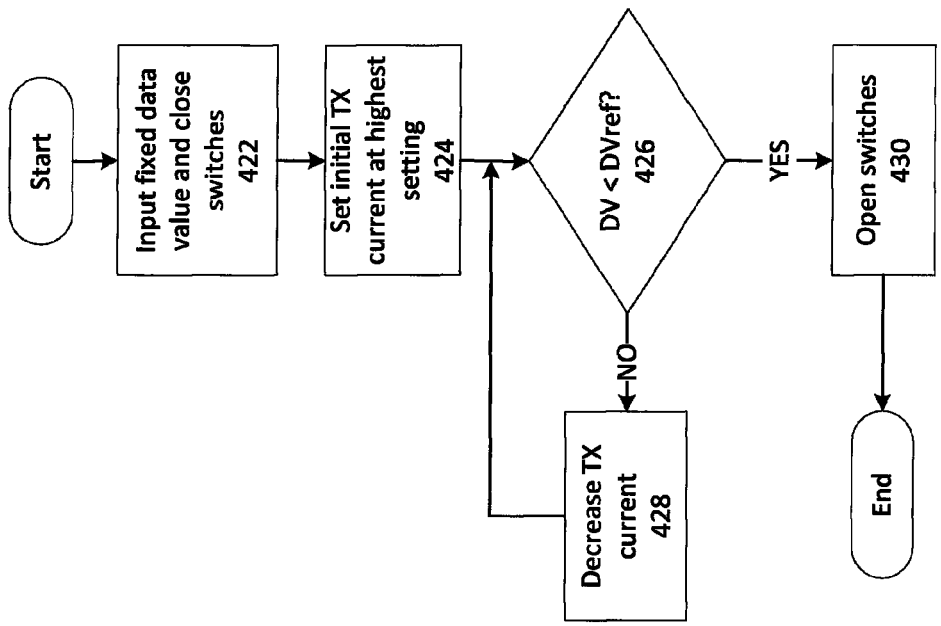
FIG. 4B is a flow chart of another method for transmitter output swing calibration using the circuit apparatus of FIG. 3 in accordance with an embodiment of the invention.
Figure 4A:
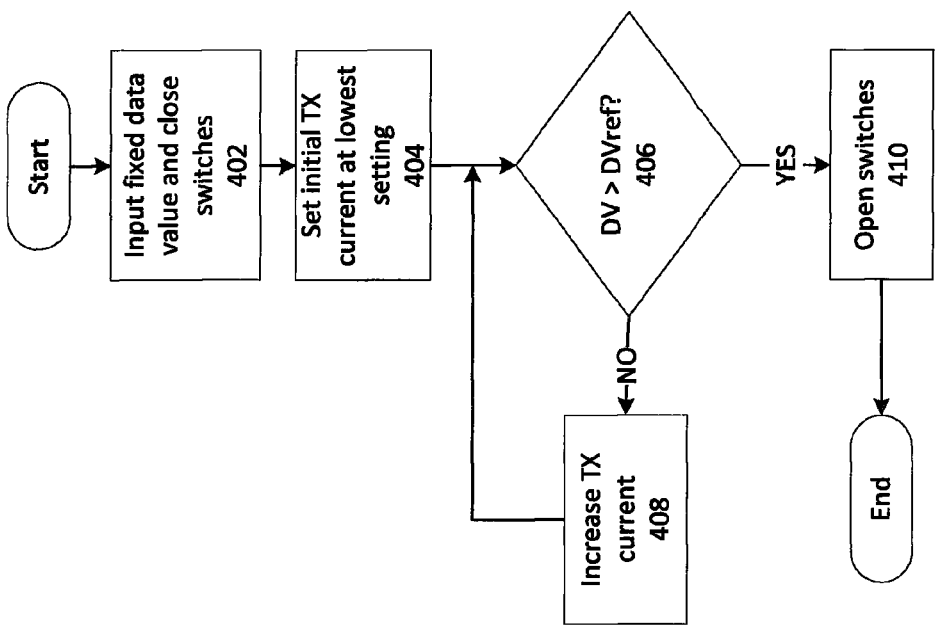
FIG. 4A is a flow chart of a method for transmitter output swing calibration using the circuit apparatus of FIG. 3 in accordance with an embodiment of the invention.

FIG. 4A is a flow chart of a method 400 for transmitter output swing calibration using the circuit apparatus 300 of FIG. 3 in accordance with an embodiment of the invention. As shown, per step 402, when transmitter is set to the output swing calibration mode, a fixed data input signal may be provided to the TX buffer circuit 102, and the switches S1 and S2 may be closed so as to connect the ADC 304 to the TX buffer circuit 102.

Per step 404, the calibration logic and control circuitry 306 may then set the TX current to be initially at a lowest setting. This may be done by sending control signals to set the variable current sources I_P and I_N to their lowest current settings. With the TX current at its lowest setting, the measured digital value DV should be initially less than the reference digital value DVref.

Thereafter, per step 406, a determination may be made as to whether DV is greater than DVref. If not, then, per step 408, the calibration logic and control circuitry 306 may increase the TX current by increasing the current provided by the variable current sources I_P and I_N. The method 400 then loops back to the determination step 406. Hence, the calibration logic and control circuitry 306 continues to increase the TX current until it determines that DV is greater than DVref.

When the calibration logic and control circuitry 306 determines per step 406 that DV is greater than DVref, then it may be decided that the output swing is properly calibrated. In that case, per step 410, the switches S1 and S2 may be opened, and the data input may be released from the fixed value, such that the TX buffer circuit 102 may return to a normal operating mode.

FIG. 4B is a flow chart of another method 420 for transmitter output swing calibration using the circuit apparatus 300 of FIG. 3 in accordance with an embodiment of the invention. As shown, per step 422, when transmitter is set to the output swing calibration mode, a fixed data input signal may be provided to the TX buffer circuit 102, and the switches S1 and S2 may be closed so as to connect the ADC 304 to the TX buffer circuit 102.

Per step 424, the calibration logic and control circuitry 306 may then set the TX current to be initially at a highest setting. This may be done by sending control signals to set the variable current sources I_P and I_N to their highest current settings. With the TX current at its highest setting, the measured digital value DV should be initially greater than the reference digital value DVref.

Thereafter, per step 426, a determination may be made as to whether DV is less than DVref. If not, then, per step 428, the calibration logic and control circuitry 306 may decrease the TX current by decreasing the current provided by the variable current sources I_P and I_N. The method 420 then loops back to the determination step 426. Hence, the calibration logic and control circuitry 306 continues to increase the TX current until it determines that DV is less than DVref.

When the calibration logic and control circuitry 306 determines per step 426 that DV is less than DVref, then it may be decided that the output swing is properly calibrated. In that case, per step 430, the switches S1 and S2 may be opened, and the data input may be released from the fixed value, such that the TX buffer circuit 102 may return to a normal operating mode.

Figure 5:
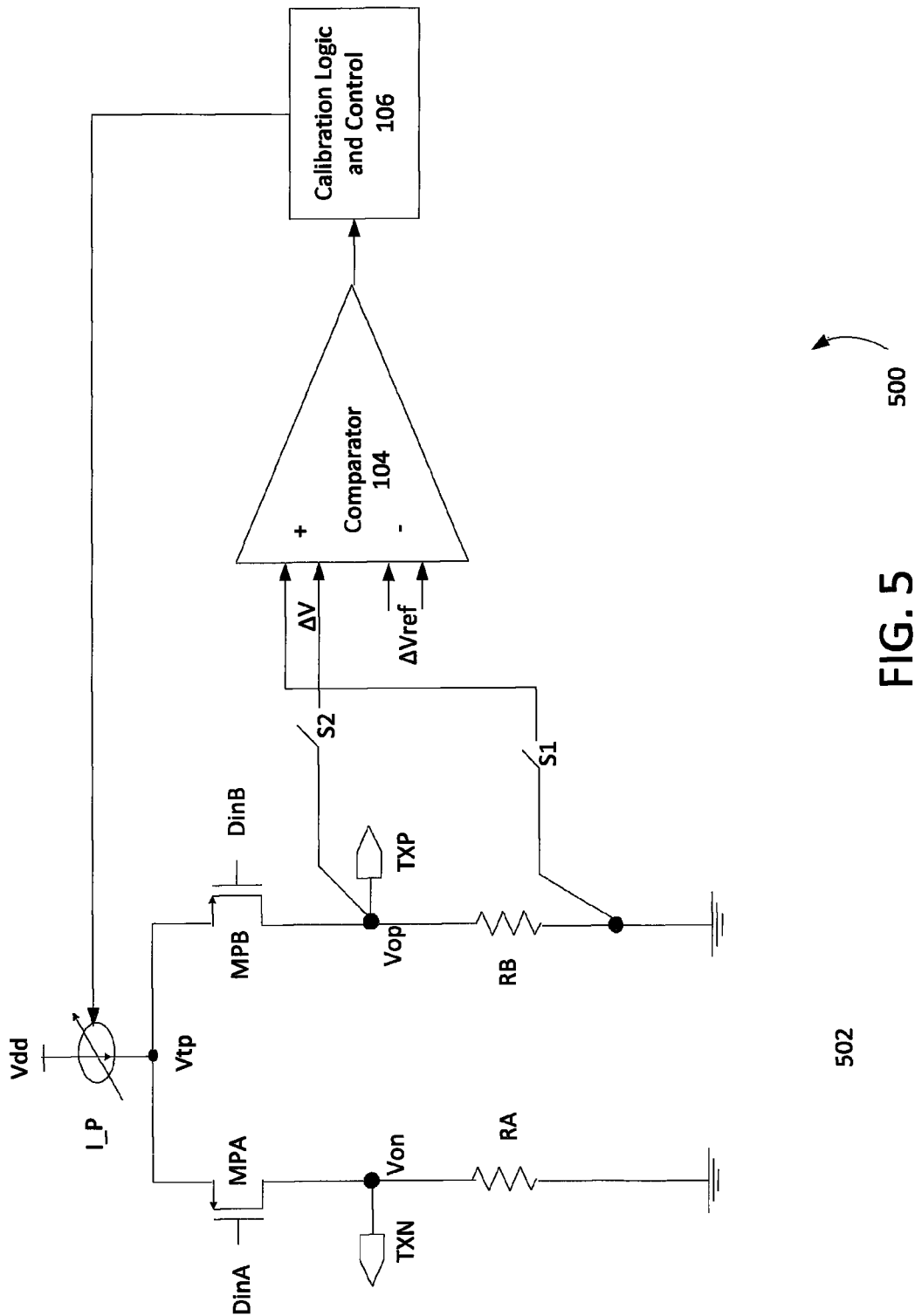
FIG. 5 is diagram of an alternate circuit apparatus for transmitter output swing calibration in accordance with an embodiment of the invention.

FIG. 5 is diagram of an alternate circuit apparatus 500 for transmitter output swing calibration in accordance with an embodiment of the invention. The circuit apparatus 500 of FIG. 5 is similar to the circuit apparatus 100 of FIG. 1. However, the TX buffer circuit 502 in FIG. 5 has a CML (current mode logic) driver structure with transistors MPA and MPB.

Per the structure shown in FIG. 5, the resistor RA may be arranged between the output node Von and ground, and the resistor RB may be arranged between the output node Vop and ground. The switch S1 may be arranged to connect a node between RB and ground to the first input terminal of the comparator 104, and the switch S2 may be arranged to connect the output node Vop to the second input terminal of the comparator 104. In calibration mode, transistor MPB may be turned on, and transistor MPA may be turned off, such that the current passes through the resistor RB.

Note that, while the embodiment depicted in FIG. 5 measures the voltage across the resistor RB, an alternate embodiment may measure the voltage across the resistor RA. In the alternate embodiment, the first switch S1 may be arranged to connect a node between RA and ground to the first input terminal of the comparator 104, and the switch S2 may be arranged to connect the output node Von to the second input terminal of the comparator 104. In this case, for the calibration mode, transistor MPA may be turned on, and transistor MPB may be turned off, such that the current passes through the resistor RA.

Further note that, while the embodiment depicted in FIG. 5 is configured to use a comparator 104 in the manner described above in relation to FIG. 1, an alternate embodiment may instead use an ADC 304 in the manner described above in relation to FIG. 3.

Figure 6:
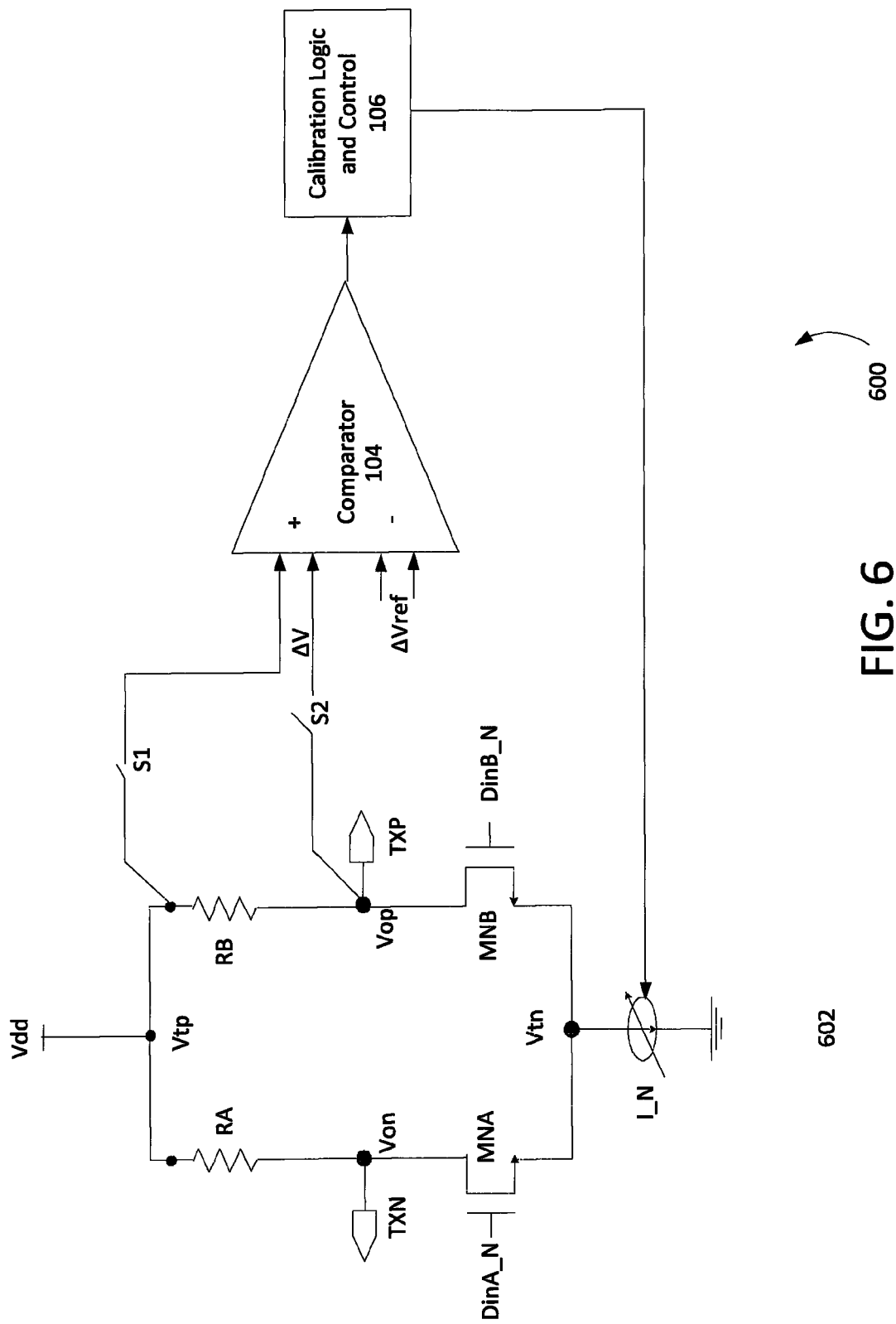
FIG. 6 is diagram of another alternate circuit apparatus for transmitter output swing calibration in accordance with an embodiment of the invention.

FIG. 6 is diagram of another alternate circuit apparatus 600 for transmitter output swing calibration in accordance with an embodiment of the invention. The circuit apparatus 600 of FIG. 6 is similar to the circuit apparatus 100 of FIG. 1. However, the TX buffer circuit 602 in FIG. 6 has a CML (current mode logic) driver structure with transistors MNA and MNB.

Per the structure shown in FIG. 6, the resistor RA may be arranged between Vdd and the output node Von, and the resistor RB may be arranged between Vdd and the output node Vop. The switch S1 may be arranged to connect a node between Vdd and RB to the first input terminal of the comparator 104, and the switch S2 may be arranged to connect the output node Vop to the second input terminal of the comparator 104. In calibration mode, transistor MNB may be turned on, and transistor MNA may be turned off, such that the current passes through the resistor RB.

Note that, while the embodiment depicted in FIG. 6 measures the voltage across the resistor RB, an alternate embodiment may measure the voltage across the resistor RA. In the alternate embodiment, the first switch S1 may be arranged to connect a node between Vdd and RA to the first input terminal of the comparator 104, and the switch S2 may be arranged to connect the output node Von to the second input terminal of the comparator 104. In this case, for the calibration mode, transistor MNA may be turned on, and transistor MNB may be turned off, such that the current passes through the resistor RA.

Further note that, while the embodiment depicted in FIG. 6 is configured to use a comparator 104 in the manner described above in relation to FIG. 1, an alternate embodiment may instead use an ADC 304 in the manner described above in relation to FIG. 3.

Figure 7:
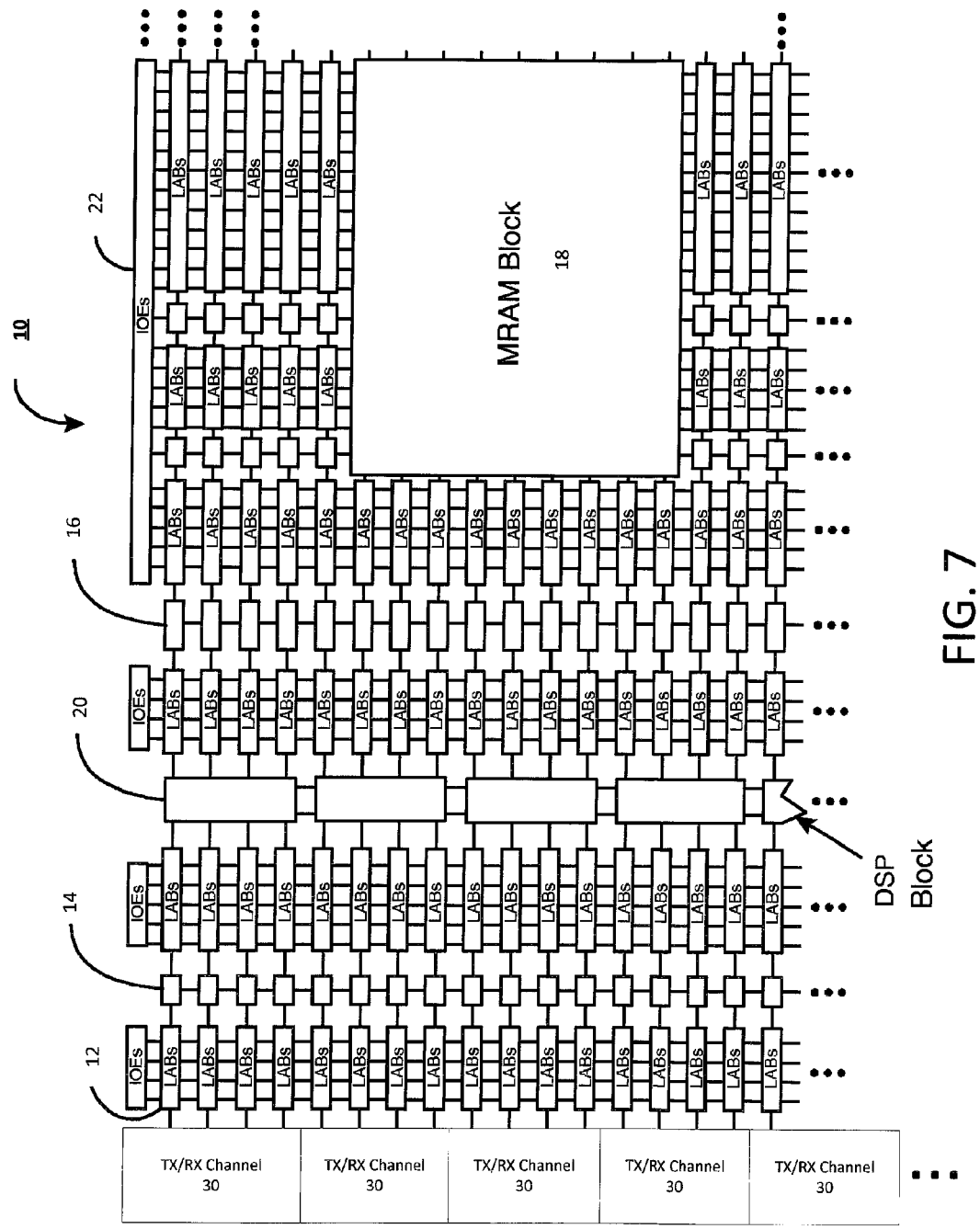
FIG. 7 is a simplified partial block diagram of an exemplary field programmable gate array that may be configured to implement an embodiment of the present invention.

FIG. 7 is a simplified partial block diagram of an exemplary field programmable gate array (FPGA) 10 that may be configured to implement an embodiment of the present invention. It should be understood that embodiments of the present invention can be used in numerous types of integrated circuits such as field programmable gate arrays (FPGAs), programmable logic devices (PLDs), complex programmable logic devices (CPLDs), programmable logic arrays (PLAs), digital signal processors (DSPs) and application specific integrated circuits (ASICs).

FPGA 10 includes within its "core" a two-dimensional array of programmable logic array blocks (or LABs) 12 that are interconnected by a network of column and row interconnect conductors of varying length and speed. LABs 12 include multiple (e.g., ten) logic elements (or LEs). A LE is a programmable logic block that provides for efficient implementation of user defined logic functions. An FPGA has numerous logic elements that can be configured to implement various combinatorial and sequential functions. The logic elements have access to a programmable interconnect structure. The programmable interconnect structure can be programmed to interconnect the logic elements in almost any desired configuration.

FPGA 10 may also include a distributed memory structure including random access memory (RAM) blocks of varying sizes provided throughout the array. The RAM blocks include, for example, blocks 14, blocks 16, and block 18. These memory blocks can also include shift registers and FIFO buffers.

FPGA 10 may further include digital signal processing (DSP) blocks 20 that can implement, for example, multipliers with add or subtract features. Input/output elements (IOEs) 22 located, in this example, around the periphery of the chip support numerous single-ended and differential input/output standards. Each IOE 22 is coupled to an external terminal (i.e., a pin) of FPGA 10. A transceiver (TX/RX) channel array may be arranged as shown, for example, with each TX/RX channel circuit 30 being coupled to several LABs. A TX/RX channel circuit 30 may include, among other circuitry, transmitter circuitry as described herein.

It is to be understood that FPGA 10 is described herein for illustrative purposes only and that the present invention can be implemented in many different types of PLDs, FPGAs, and ASICs.

Figure 8:
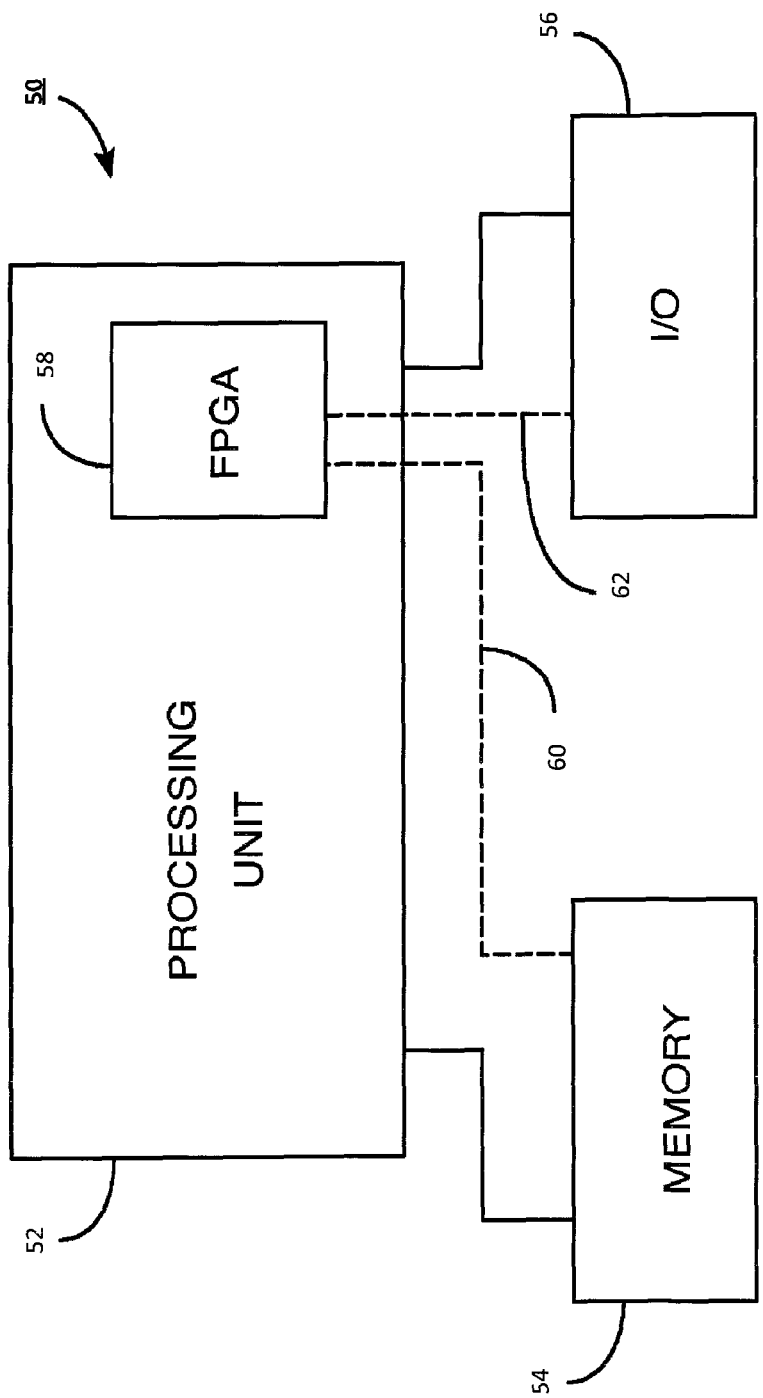
FIG. 8 shows a block diagram of an exemplary digital system that may employ the methods and apparatus disclosed herein.

FIG. 8 shows a block diagram of an exemplary digital system 50 that may employ apparatus and methods disclosed herein. System 50 may be a programmed digital computer system, digital signal processing system, specialized digital switching network, or other processing system. Moreover, such systems can be designed for a wide variety of applications such as telecommunications systems, automotive systems, control systems, consumer electronics, personal computers, Internet communications and networking, and others. Further, system 50 may be provided on a single board, on multiple boards, or within multiple enclosures.

System 50 includes a processing unit 52, a memory unit 54, and an input/output (I/O) unit 56 interconnected together by one or more buses. According to this exemplary embodiment, FPGA 58 is embedded in processing unit 52. FPGA 58 can serve many different purposes within the system 50. FPGA 58 can, for example, be a logical building block of processing unit 52, supporting its internal and external operations. FPGA 58 is programmed to implement the logical functions necessary to carry on its particular role in system operation. FPGA 58 can be specially coupled to memory 54 through connection 60 and to I/O unit 56 through connection 62.

Processing unit 52 may direct data to an appropriate system component for processing or storage, execute a program stored in memory 54, receive and transmit data via I/O unit 56, or other similar function. Processing unit 52 may be a central processing unit (CPU), microprocessor, floating point coprocessor, graphics coprocessor, hardware controller, microcontroller, field programmable gate array programmed for use as a controller, network controller, or any type of processor or controller. Furthermore, in many embodiments, there is often no need for a CPU.

For example, instead of a CPU, one or more FPGAs 58 may control the logical operations of the system. As another example, FPGA 58 acts as a reconfigurable processor that may be reprogrammed as needed to handle a particular computing task. Alternately, FPGA 58 may itself include an embedded microprocessor. Memory unit 54 may be a random access memory (RAM), read only memory (ROM), fixed or flexible disk media, flash memory, tape, or any other storage means, or any combination of these storage means.

In the above description, numerous specific details are given to provide a thorough understanding of embodiments of the invention. However, the above description of illustrated embodiments of the invention is not intended to be exhaustive or to limit the invention to the precise forms disclosed. One skilled in the relevant art will recognize that the invention can be practiced without one or more of the specific details, or with other methods, components, etc.

In other instances, well-known structures or operations are not shown or described in detail to avoid obscuring aspects of the invention. While specific embodiments of, and examples for, the invention are described herein for illustrative purposes, various equivalent modifications are possible within the scope of the invention, as those skilled in the relevant art will recognize. These modifications may be made to the invention in light of the above detailed description.

What is claimed is:

1. An integrated circuit comprising:
   a transmitter buffer circuit comprising
      a current source that drives current through a first node,
      a first transistor having a source coupled to the first node, a gate that receives a first single-ended clocked data signal of a differential data input, and a drain that is connected to a first differential output node, wherein the first transistor is turned off while in an output swing calibration mode due to the differential data input having a fixed data input value while in the output swing calibration mode,
      a second transistor having a source coupled to the first node, a gate that receives a second single-ended clocked data signal of the differential data input, and a drain that is connected to a second differential output node, wherein the second transistor is turned on while in the output swing calibration mode due to the differential data input having the fixed data input value while in the output swing calibration mode,
      a first resistor having a first end connected to a second node and a second end connected to the first differential output node, and
      a second resistor having a first end connected to the second node and a second end connected to the second differential output node;
   a first switch having first and second ends, wherein the first end of the first switch is connected to the first end of the second resistor, and the first switch is closed during the output swing calibration mode and open during the operating mode;
   a second switch having first and second ends, wherein the first end of the second switch is connected to the second end of the second resistor, and the second switch is closed during the output swing calibration mode and open during an operating mode;
   calibration logic and control circuitry that provides the fixed data input value to the transmitter buffer circuit and calibrates an output swing of the transmitter buffer circuit during the output swing calibration mode based on a measured voltage difference across the second resistor that is communicated by way of the first and second switches, wherein the output swing of the transmitter buffer circuit is adjusted by at least varying a current of the current source in the transmitter buffer circuit.

2. The integrated circuit of claim 1, further comprising:
   a comparator having a first input terminal connected to the second end of the first switch and a second input terminal connected to the second end of the second switch, such that, during the output swing calibration mode, the comparator receives the measured voltage difference, the comparator toggling a state based on a comparison of the measured voltage against a reference voltage difference.

3. The integrated circuit of claim 2, wherein the calibration logic and control circuitry adjusts the output swing of the transmitter buffer circuit in one direction until the toggling of the state of the comparator occurs.

4. The integrated circuit of claim 1 further comprising:
   an analog-to-digital converter (ADC) that receives the measured voltage difference and outputs a digital signal to the calibration logic and control circuitry, and the calibration logic and control circuitry adjusting the output swing of the transmitter buffer circuit based at least on the digital signal.

5. The integrated circuit of claim 1, wherein the second node of the transmitter buffer circuit comprises a common mode voltage node.

6. The integrated circuit of claim 1, wherein the second node of the transmitter buffer circuit comprises a ground node.

7. A method for transmitter output swing calibration, the method comprising:
   closing first and second switches which electrically connect output swing calibration circuitry to first and second ends, respectively, of a resistor in a transmitter buffer circuit during an output swing calibration mode;
   providing a fixed value as a data input for a transmitter buffer circuit such that a first transistor in the transmitter buffer circuit is turned off while in an offset swing calibration mode and a second transistor in the transmitter buffer circuit is turned on while in the output swing calibration mode,
   wherein the sources of the first and second transistors are connected to a first node, the drains of the first and second transistors are connected to differential output nodes, a first end of the resistor is connected to the drain of the second transistor, and a second end of the resistor is connected to a second node;
   setting a current of a current source in the transmitter buffer circuit to an initial setting, wherein the current source is connected to the first node;
   adjusting the transmitter current by varying the current of the current source in the transmitter buffer circuit until the output swing of the transmitter buffer circuit is calibrated; and
   releasing the data input from the fixed value and opening the first and second switches to electrically disconnect the output swing calibration circuitry after the output swing of the transmitter buffer circuit is calibrated.

8. The method of claim 7, further comprising:
   receiving a measured voltage difference across the resistor; and
   comparing the measured voltage difference against a reference voltage difference.

9. The method of claim 8, wherein said comparing is performed by a comparator, further comprising:
   adjusting the output swing of the transmitter buffer circuit in one direction until a toggling of a state of the comparator occurs.

10. The method of claim 8, wherein the reference voltage difference is a digital signal, further comprising:
    converting the measured voltage difference from an analog signal to a digital signal prior to comparing the measured voltage difference against the reference voltage difference.

11. The method of claim 8, wherein the second node is a common mode voltage node.

12. The method of claim 8, wherein the second node is a ground node.

13. An output swing calibration circuit to calibrate an output swing of a transmitter buffer circuit, the output swing calibration circuit comprising:

comparison circuitry that compares a measured voltage difference across a resistor in the transmitter buffer circuit against a reference voltage difference and outputs a comparison result; and logic and control circuitry that provides a fixed data input value to the transmitter buffer circuit such that a first transistor is turned off and a second transistor is turned on while in an output swing calibration mode and that adjusts the output swing of the transmitter buffer circuit based on the comparison result while the fixed data input value is provided, wherein the output swing is adjusted by varying a current of a current source in the transmitter buffer circuit, wherein sources of the first and second transistors are connected to a first node, a first end of the resistor is connected to a second node, and a second end of the resistor is connected to a drain of the second transistor.

14. The output swing calibration circuit of claim 13, wherein the comparison circuitry comprises a circuit from a group of circuits consisting of an analog comparator circuit and an analog-to-digital conversion circuit.

15. The output swing calibration circuit of claim 13, wherein the second node is a common mode voltage node.

16. The output swing calibration circuit of claim 13, wherein the second node is a ground node.

17. The output swing calibration circuit of claim 13, wherein the second node is a power supply voltage node.

18. The integrated circuit of claim 1, wherein the second node is a power supply voltage node.

19. The method of claim 8, wherein the second node is a power supply voltage node.

\* \* \* \* \*